(12) United States Patent
Chou et al.

(10) Patent No.: US 7,196,369 B2
(45) Date of Patent: Mar. 27, 2007

(54) PLASMA DAMAGE PROTECTION CIRCUIT FOR A SEMICONDUCTOR DEVICE

(75) Inventors: Ming Hung Chou, Miaoli (TW); Tu Shun Chen, Yunlin (TW); Smile Huang, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 488 days.

(21) Appl. No.: 10/195,706

(22) Filed: Jul. 15, 2002

(65) Prior Publication Data

US 2004/0007730 A1 Jan. 15, 2004

(51) Int. Cl.
*H01L 29/788* (2006.01)
(52) U.S. Cl. .................... 257/315; 257/320
(58) Field of Classification Search ........ 257/314–320; 438/201, 211, 257, 260–262, 266
See application file for complete search history.

(56) References Cited

U.S. PATENT DOCUMENTS

| | | | |
|---|---|---|---|
| 4,528,583 A | 7/1985 | te Velde et al. | |
| 4,635,230 A | 1/1987 | Thomas et al. | |
| 4,654,824 A | 3/1987 | Thomas et al. | |
| 4,669,180 A | 6/1987 | Thomas et al. | |
| 5,466,622 A | 11/1995 | Cappelletti | |
| 5,548,146 A * | 8/1996 | Kuroda et al. ............... 257/321 | |
| 5,559,368 A | 9/1996 | Hu et al. | |
| 5,760,445 A | 6/1998 | Diaz | |
| 5,913,120 A | 6/1999 | Cappelletti | |
| 5,962,888 A * | 10/1999 | Kim et al. .................... 257/315 | |
| 5,994,742 A | 11/1999 | Krishnan et al. | |
| 5,998,299 A | 12/1999 | Krishnan | |
| 6,080,658 A | 6/2000 | Huang et al. | |
| 6,113,648 A | 9/2000 | Schuelein et al. | |
| 6,166,584 A | 12/2000 | De | |
| 6,172,392 B1 * | 1/2001 | Schmidt et al. ............. 257/315 |
| 6,218,895 B1 * | 4/2001 | De et al. .................... 257/371 |
| 6,252,280 B1 | 6/2001 | Hirano | |
| 6,261,878 B1 | 7/2001 | Doyle et al. | |
| 6,271,713 B1 | 8/2001 | Krishnamurthy | |
| 6,274,921 B1 * | 8/2001 | Hasegawa .................... 257/577 |
| 6,277,723 B1 | 8/2001 | Shih et al. | |
| 6,291,281 B1 | 9/2001 | Wang et al. | |
| 6,300,819 B1 | 10/2001 | De et al. | |
| 6,306,691 B1 | 10/2001 | Koh | |
| 6,307,233 B1 * | 10/2001 | Awaka et al. ............... 257/368 |
| 6,313,503 B1 * | 11/2001 | Lee et al. .................... 257/324 |
| 6,320,423 B1 | 11/2001 | Sato | |
| 6,323,076 B1 | 11/2001 | Wilford | |
| 6,388,498 B1 * | 5/2002 | Moriwaki et al. .......... 327/333 |

(Continued)

OTHER PUBLICATIONS

US 6,342,723, 01/2002, Wilford (withdrawn)

*Primary Examiner*—Hung Vu
(74) *Attorney, Agent, or Firm*—Kenta Suzue; Haynes Beffel & Wolfeld LLP

(57) ABSTRACT

A protection device and a method for manufacturing integrated circuit devices protect against plasma charge damage, and related charge damage during manufacture. The protection device comprises a dynamic threshold, NMOS/PMOS pair having their respective gate terminals coupled to the semiconductor bulk in which the channel regions are formed. With proper metal connection, the structure protects against plasma charge damage on the integrated circuit device during manufacture, and can also be operated to protect against abnormal voltages during operation of the circuit.

15 Claims, 3 Drawing Sheets

U.S. PATENT DOCUMENTS 6,437,408 B1 * 8/2002 Shih et al. .................. 257/361
6,466,489 B1 * 10/2002 Ieong et al. ................ 257/393
6,468,848 B1 * 10/2002 Awaka et al. ............... 438/199
6,512,700 B1 * 1/2003 McPartland et al. ........ 257/316

* cited by examiner

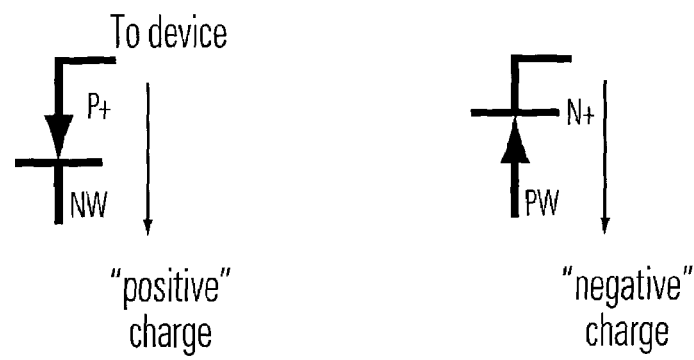
FIG. 1A (Prior Art)  FIG. 1B (Prior Art)
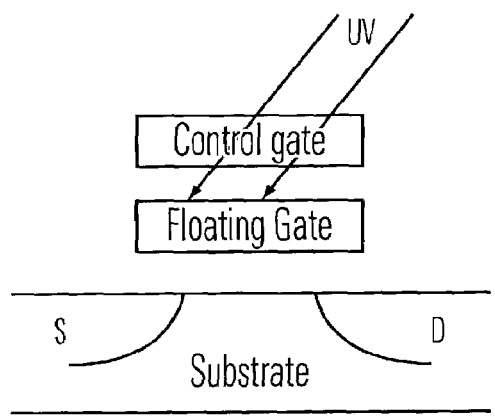
FIG. 2 (Prior Art)
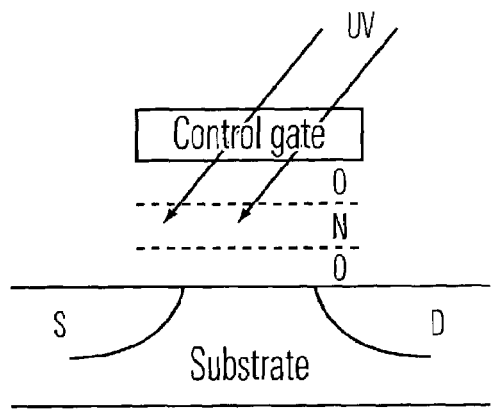
FIG. 3

PLASMA DAMAGE PROTECTION CIRCUIT FOR A SEMICONDUCTOR DEVICE

BACKGROUND OF THE INVENTION

1. Field of the Invention

The present invention relates to integrated circuit devices and integrated circuit device manufacturing, including manufacturing of non-volatile memory devices, and more particularly to devices and processes for protection of integrated circuitry from plasma damage during manufacture.

2. Description of Related Art

In the manufacturing of integrated circuits, the processes are utilized which utilize activated ions. For example, back-end processes including metal etching, photoresist stripping, and deposition of inter-metal dielectrics, involve plasmas which induce charge on the structures being treated. These plasma induced charges may damage underlying structures in the device, including structures critical to device performance. For example, tunnel dielectrics used in flash memory devices, gate dielectrics, and inter-polysilicon dielectrics, can be damaged by plasma induced charge. Furthermore, the charge storage structure utilized in SONOS cells is particularly susceptible to damage by plasma based processes. SONOS memory devices are described in U.S. Pat. No. 6,011,725.

One characteristic of the plasma induced charge is that it may be either positive or negative, and different types of damage can occur based on the type of induced charge.

In conventional semiconductor devices, protection from plasma induced charge is provided by forming a protection diode as shown in FIGS. 1A and 1B. A protection diode between a p-type region and an n-type well is formed to release "positive" charge from a node coupled to the p-type region as illustrated in FIG. 1A. A protection diode between an n-type region and the p-type well is formed to release "negative" charge from a node coupled to the n-type region, as shown in FIG. 1B. However, the structure of FIG. 1A does not discharge negative charge until the charge buildup is negative enough for junction breakdown. Likewise, the structure of FIG. 1B does not discharge positive charge until the charge buildup is positive enough for junction breakdown. These protection devices are useful and easy to implement. However, if the plasma exposure is too high, damage continues to happen with these prior art structures.

In floating gate memory devices as shown in FIG. 2, or other stacked gate structures, plasma charge builds up in the floating gate structure, and results in the cell threshold shifting up during the manufacturing process. Typically, the device is exposed to ultraviolet radiation after processing. The radiation causes the built up charge to be discharged to near normal conditions. However, damage to the cell structure caused by the plasma processes is not repaired.

For SONOS devices as illustrated in FIG. 3, plasma damage is more difficult to repair. The charge buildup caused by plasma based processes cannot be neutralized by ultraviolet exposure, as used in floating gate nonvolatile memory cells. The ultraviolet radiation injects additional electrons into the nitride film shifting the threshold voltage of the memory cell. Furthermore, because the threshold voltage is increased in SONOS devices for either positive or negative charge stress, the typical junction breakdown protection device is not sufficient. Back-to-back junction diodes can be used. However, the combination does not provide sufficient protection because the cell will be damaged before the junction breakdown levels are reached.

Accordingly, it is desirable to provide a protection circuit for use in the manufacturing of integrated circuits that protect both positive and negative charge damage. Furthermore, the protection circuit should not affect device operation after manufacturing. Finally, the protection circuit should be easily manufacturable.

SUMMARY OF THE INVENTION

The present invention provides a protection device, and a method for manufacturing integrated circuit devices, for protecting against plasma charge damage, and related charge damage during manufacture. The protection device comprises a dynamic threshold, NMOS/PMOS pair having their respective gate terminals coupled to the semiconductor bulk in which the channel regions are formed. With proper metal connection, the structure protects against plasma charge damage on the integrated circuit device during manufacture, and can also be operated to protect against abnormal voltages during operation of the circuit.

In one aspect, the present invention provides an integrated circuit device, which includes a device substrate. Integrated circuitry is formed on the device substrate. The integrated circuitry is coupled to a node having voltages applied thereto during operation of integrated circuitry. A PMOS device having a gate, a source and drain, and an NMOS device having a gate, a source and drain are formed on the device substrate. One of the source and drain of the PMOS device is coupled to said node. The other of the source and drain of the PMOS device is coupled to a ground reference. One of the source and drain of the NMOS device is coupled to said node. The other of the source and drain of the NMOS device is coupled to a ground reference. The gate of the PMOS device is coupled to the bulk semiconductor in which the channel of the device is formed. Likewise, the gate of the NMOS device is coupled to the bulk semiconductor in which the channel of the device is formed. During manufacturing, the gate of the PMOS device and the gate of the NMOS device are left floating.

Thus, during manufacture, dynamic threshold MOS devices are coupled to a node in the integrated circuit, which is to be protected from plasma charge damage. The dynamic threshold MOS devices are conductive with relatively low charge on the gate. Both positive and negative charges are discharged through the devices for protecting the node of the integrated circuit from plasma charge damage. During operation of the integrated circuit, voltages are applied to the gates of the dynamic threshold MOS devices, which turn off the dynamic threshold MOS devices during normal operation. Thus, the gate of the PMOS device is connected during operation to a voltage, such as a high positive voltage greater than the supply potential on the integrated circuit, which is high enough to turn off the PMOS device when the highest operating potential is applied to the node. The gate of the NMOS device is connected to a voltage during operation, such as a negative voltage, which is low enough to turn off the NMOS device when the lowest operating potential is applied to the node.

According to another aspect of the invention, the integrated circuitry includes memory array having a word line coupled to a row of memory cells in the array. The word line is coupled to said node in the protection device to protect memory cells along the word line from plasma charge damage. In one embodiment, the memory cells comprise SONOS cells. In another embodiment, the memory cells comprise floating gate memory cells.

According to yet another embodiment, the integrated circuit device includes a non-volatile memory circuit to be protected from plasma damage during manufacture. The memory circuit has a plurality of operating modes during which operating voltages are applied to word lines in the memory array. The plurality of operating modes includes a read mode, a program mode and an erase mode. During the program mode, a programming voltage is applied to the word lines using a charge pump or other voltage generator, which generates a voltage higher than the supply potential provided to the device from an external power supply. The voltage applied to the gate of the PMOS device during the program mode is at least as high as said programming voltage. During the erase mode, an erasing voltage is applied to the word line, which is a negative voltage. The voltage applied to the gate of the NMOS device during the erase mode is at least as low as said negative voltage.

In one embodiment of the invention, the PMOS device comprises an n-type well in said substrate, which acts as the semiconductor bulk in which the channel of the PMOS device is formed, and p-type source and drain regions in the n-type well. The gate of the PMOS device is coupled to said n-type well. Also in some embodiments, the NMOS device comprises a deep n-type well in said substrate, with the p-type well within the n-type well. The p-type well acts as the semiconductor bulk in which the channel of the NMOS device is formed. N-type source and drain regions are formed within the p-type well, and the gate of the NMOS device is coupled to the p-type well.

The present invention also provides a method for manufacturing an integrated circuit device. The method includes forming integrated circuitry on a substrate, the circuitry having a node to be protected from plasma charge damage. Also, a dynamic threshold PMOS device and a dynamic threshold NMOS device are formed on the substrate. The PMOS device and the NMOS device have characteristics such as those described above, and provide protection for the integrated circuitry against plasma charge damage. Thus, the method also includes coupling one of the source and drain of the PMOS device to said node, and other of the source and drain of the PMOS device to a ground reference. Also, the method includes coupling one of the source and drain of the NMOS device to said node, and other of the source and the drain of the NMOS device to a ground reference. The method also includes floating the gate of the PMOS device and the gate of the NMOS device during manufacturing steps that exposed the integrated circuitry to plasma or other processes that may cause charge damage. Circuitry is provided on the substrate to bias the gate of the PMOS device during operation to a voltage at least as high as operating voltages applied to the node by the integrated circuitry during operation. Likewise, circuitry is provided on the substrate to bias the gate of the NMOS device during operation to a voltage at least as low as operating voltages applied to the node by the integrated circuitry during operation.

The method of manufacturing according to the present invention is applied to all kinds of integrated circuits, and particularly to non-volatile memory circuits including memory circuits based on SONOS memory cells.

Accordingly, the present invention provides a PMOS transistor and an NMOS transistor. The gates of the PMOS and NMOS transistors are floating during manufacturing, and coupled to a first voltage and a second voltage, respectively, during operation. The PMOS device protects against positive charge and the NMOS device protects against negative charge. During manufacturing, because the gates of the PMOS and NMOS devices are floating, the PMOS transistor can discharge positive charge, and the NMOS transistor can discharge negative charge. In addition, during operation, the PMOS transistor can discharge positive charge higher than operation voltages, and the NMOS transistor can discharge negative charge lower than the operation voltages.

In embodiments for which protection is desired for only one of positive and negative charge, then only one of the NMOS and PMOS transistors may be used.

Other aspects and advantages of the present invention can be seen on review of the drawings, the detailed description and the claims, which follow.

BRIEF DESCRIPTION OF THE DRAWINGS

FIG. 1A and FIG. 1B illustrate prior art junction based protection devices.

FIG. 2 shows exposure of a floating gate device to ultraviolet radiation as used in prior art techniques.

FIG. 3 shows exposure of a SONOS device to ultraviolet radiation.

DETAILED DESCRIPTION

Figure 4:
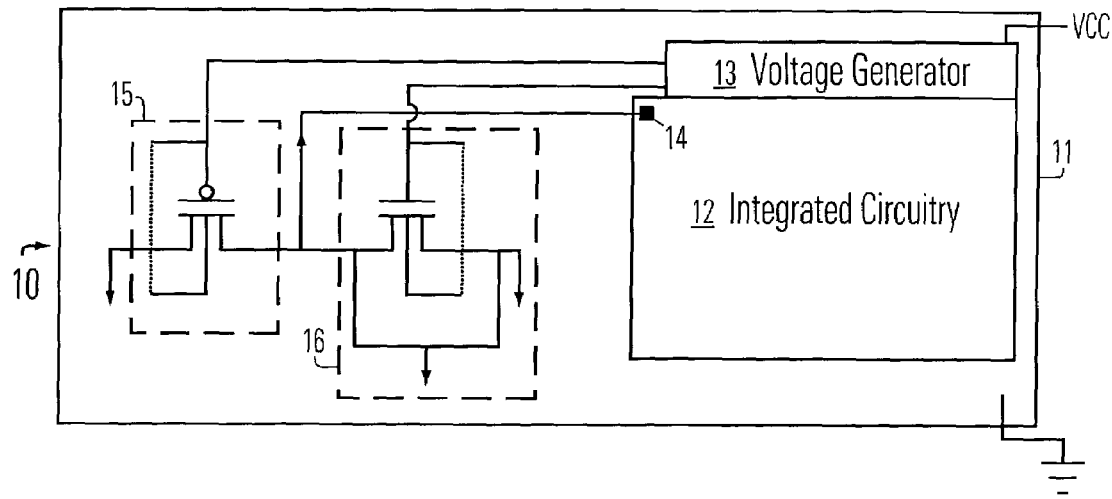
FIG. 4 is a simplified block diagram of an integrated circuit including the protection circuit of the present invention.
Figure 5:
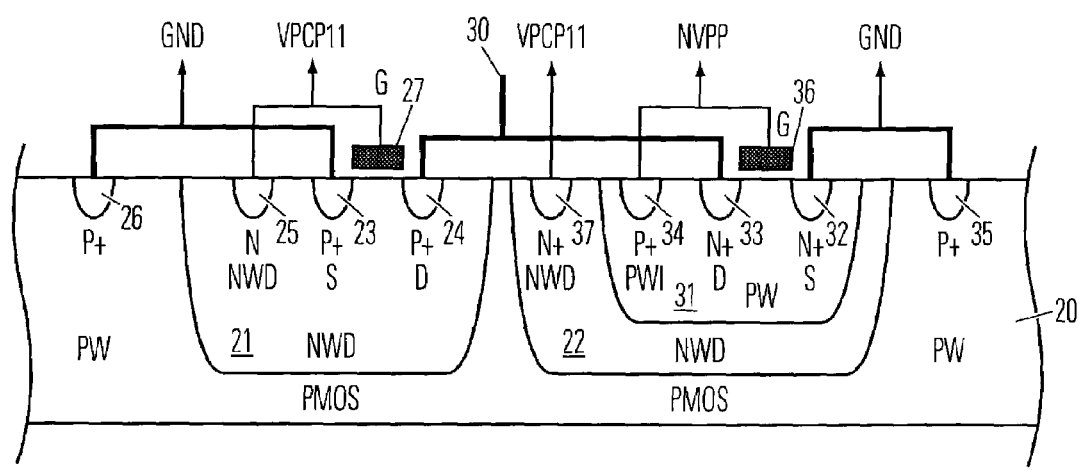
FIG. 5 illustrates a cross-sectional view of one embodiment of the protection circuit according to the present invention.
Figure 6:
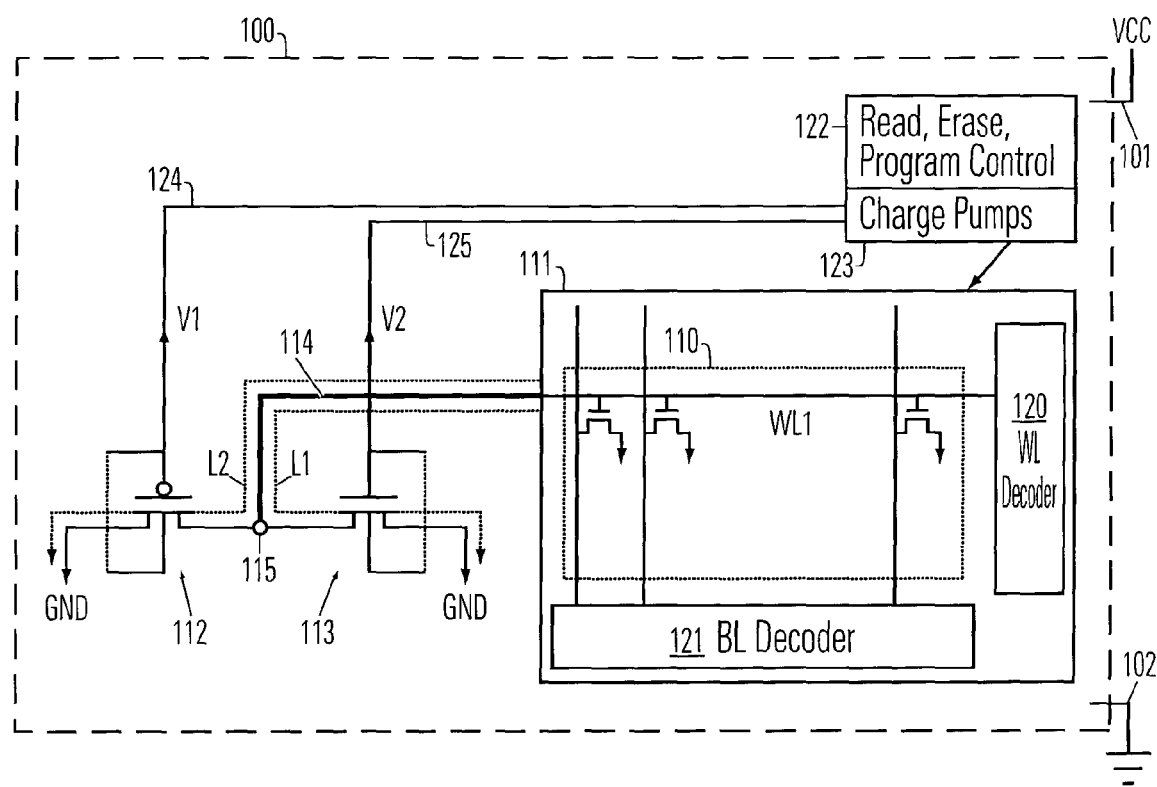
FIG. 6 shows a simplified diagram of an integrated circuit memory device, including protection circuits according to the present invention.

A detailed description of embodiments of the present invention is provided with reference to FIGS. 4–6. FIG. 4 illustrates an integrated circuit device 10 including a protection circuit according to the present invention. The integrated circuit device includes a device substrate 11. Integrated circuitry 12 on the device substrate performs the "mission" operations for the device 10. The "mission" operations may include providing memory, logic functions, processor functions, or any of a wide variety of functions provided by integrated circuitry.

A power supply provides a supply voltage VCC and a ground reference for the device substrate 11. Voltage generator circuitry 13 on the device substrate 11 provides operational voltages for the integrated circuit 12, including a lower operating voltage and a higher operating voltage for a node 14.

The protection device on the device substrate includes a PMOS transistor 15 and an NMOS transistor 16. One of the source/drain terminals of the PMOS transistor 15 is coupled to ground. The other of the source/drain terminals of the PMOS transistor 15 is coupled to the node 14 via a conductive line. The gate of the PMOS transistor 15 is coupled to the semiconductor bulk in which the channel of the transistor is formed. Also, the gate of the PMOS transistor 15 is coupled to line 17 across which the voltage generator 13 supplies during operation of the device a voltage at least as high as the higher operating voltage applied during operation to node 14. During manufacture, the line 17 is floating.

One of the source/drain terminals of the NMOS transistor 16 is coupled to ground. The other of the source/drain terminals of the NMOS transistor 16 is coupled to the node 14 via a conductive line. The gate of the NMOS transistor 16 is coupled to the semiconductor bulk in which the channel of the transistor is formed. Also, the gate of the NMOS transistor 16 is coupled to line 18 across which the voltage generator supplies during operation of the device a voltage at least as low as the lower operating voltage applied during operation to node 14. During manufacture, the line 18 is floating.

The structure of the protection device, according to the present invention, can be understood with reference to the example shown in FIG. 5. FIG. 5 illustrates a semiconductor substrate 20 (PW) having an intrinsic p-type doping. A first deep n-type well 21 (NWD) and a second deep n-type well 22 (NWD) are formed by diffusion of n-type dopants into the substrate 20. The PMOS transistor has a p-type source 23 and a p-type drain 24 formed within the first deep n-type well 21. An n-type contact 25 is formed on the surface of the first deep n-type well 21. The p-type contact region 26 is formed in the surface of the substrate 20 (PW), preferably adjacent to the first deep n-type well 21. A gate 27 is formed over an insulator (not shown) between the source 23 and the drain 24 over the channel region. The first deep n-type well 21 acts as the semiconductor bulk within which the channel region is formed. The gate 27 is coupled to the first deep n-type well 21 via the contact 25. The source 23 is coupled to the substrate 20 via the contact 26, and to a ground reference. The drain 24 is coupled via a conductive line to a node 30 to be protected in integrated circuitry on the device. The gate 27 is also coupled to a circuit on the device which supplies the highest voltage VPCP11 available during operation, in one embodiment. The voltage on the gate 27 is at least as high as the highest operating voltage applied to the node 30 during operation, and is high enough to bias the PMOS transistor in a normally off position during operation of the device. During manufacture, node 30 is left floating.

Within the second deep n-type well 22, a deep p-type well 31 (PWI) is formed. The NMOS transistor has a source 32 and a drain 33 formed within the p-type well 31 (PWI). A p-type contact 34 is formed by diffusion in the surface of the p-type well 31. Also, a p-type contact 35 is formed in the surface of the substrate 20, preferably adjacent the second deep n-type well 22. A gate 36 is formed over an insulator (not shown) over the channel region between the source 32 and a drain 33 of the NMOS transistor. The gate 36 is coupled to the contact 34, so that the gate of the NMOS device is coupled to the semiconductor bulk in which the channel of the NMOS device is formed. The source 32 of the NMOS transistor is coupled to the terminal 35 and to a ground reference. The drain 33 of the NMOS transistor is coupled to the node 30. A contact 37 is formed in the surface of the second deep n-type well 22. The contact 37 is coupled to the highest voltage VPCP11 generated on that chip during operation, or to another voltage level sufficient to maintain isolation of the p-type well 31. The gate 36 of the NMOS transistor is coupled to a circuit which supplies the lowest voltage NVPP provided on the chip, at least as low as the lowest voltage applied at the node 30 during operation, or to a circuit which provides a voltage low enough to turn off the NMOS device during operation of the circuitry. During manufacturing, the gate 36 is left floating.

The gate insulator between the gate and channel of the NMOS transistor and of the PMOS transistor should be strong enough to withstand the high or low voltages applied during operation of the device. For example, the gate insulator comprises a relatively thick oxide, compared to gate oxide thicknesses for logic transistors, in one embodiment of the device.

FIG. 6 illustrates a semiconductor memory device including a protection circuit according to the present invention. The device includes a substrate 100, a power supply terminal 101, and a ground terminal 102. Integrated circuitry on the device includes a memory structure 111 including an array 110 of memory cells, such as SONOS cells. The memory array 110 in various embodiments comprises DRAM cells, SRAM cells, mask ROM cells, floating gate memory cells, and other types of memory device structures. The memory structure includes the word line decoder 120 and a bit line decoder 121 and other supporting circuitry known in the art for memory devices. Supporting circuitry on the device in this example includes a read, erase and program mode control logic 122, charge pumps 123 for supplying high positive and negative voltages supporting the operation modes of the memory array, and other supporting circuitry not shown. Within the array 110, a word line, such as word line WL1, is coupled to a row of memory cells to be protected from damage by the protection circuit of the present invention.

The protection circuit on the substrate 110 includes a PMOS transistor 112, and an NMOS transistor 113 constructed as discussed above with reference to FIG. 5. The drains of the PMOS transistor 112 and NMOS transistor 113 are coupled to the node 115, which is connected via a line 114 to the word line WL1. The sources of the PMOS transistor 112 and the NMOS transistor 113 are coupled to ground reference terminals. The gate of the PMOS transistor 112 is coupled via the line 124 to a voltage V1, supplied in this example by the charge pump circuitry 123. The gate of the NMOS transistor 113 is coupled via the line 125 to the voltage V2, supplied in this example by the charge pump circuitry 123.

In this embodiment, during the manufacturing process for the device 100, the first voltage V1 and the second voltage V2 are floating, so that the gates as the PMOS transistor 112 and the NMOS transistor 113 are floating. Therefore, the device 100 can be protected from plasma charge having both positive and negative polarities. Negative charges are well protected by the NMOS transistor 113 by the current path L1. Positive charges are well protected by the PMOS transistor 112 via the current path L2.

During operation of the device 100, the first voltage V1 and the second voltage V2 are supplied with values that depend on the operating process. In the flash memory example, different voltages are applied for the various operating modes (read, erase, program) of the memory. In the memory embodiment described, the voltages applied to word line WL1, the NMOS transistor 113 and the PMOS transistor 112 are shown in the following table (refer to FIG. 5 for NMOS and PMOS terminals).

|  | PROGRAM | ERASE | READ |
|---|---|---|---|
| WORD LINE: NMOS: | 11.5 V | −3 V | 2.6 V |
| GATE/PWI | GND | NVPP | GND |
| NWD | VPCP11 | VCC | VCC |
| SOURCE/PW PMOS: | GND | GND | GND |
| GATE/NWD | VPCP11 | VCC | VCC |
| SOURCE/PW | GND | GND | GND |

Within the table, the parameter VPCP11 corresponds to the highest voltage available on the chip, or to a voltage at least as high as the highest voltage applied to the word line, and high enough to turn off the PMOS transistor during operation of the device. Also, the parameter NVPP corresponds to the lowest negative voltage available on the chip, or to a voltage at least as low as the lowest voltage applied to the word line, and low enough to turn off the NMOS transistor during operation of the device.

As can be seen, the operating voltages for the integrated circuit in the memory example are different in the different operating modes. During the programming process, the operating voltage on the word line may be, for example, 11.5 V. During erasing in reading, the operating voltages on the word line are −3 V and +2.6 V, respectively. Thus, during the programming mode, the normal operating voltage on the word line will not turn on the PMOS transistor 112. Thus, the normal operating voltage of the word line is not disturbed. However, when an abnormal voltage, such as a voltage higher than the normal operating voltages or lower than the normal operating voltages occurs, the PMOS transistor 112 and the NMOS transistor 113 will turn on to discharge the abnormal voltage so as to protect the memory array. In this case for the programming mode, an abnormal voltage higher than 11.5 V or lower than ground can be discharged. Likewise, by setting the voltage on the gates of the protection devices properly, during erasing and reading modes, normal operating voltages are not discharged by the protection device, while abnormal voltages may be discharged to protect the device.

Thus, the present invention provides a protection circuit based on a dynamic threshold MOS pair of transistors. Positive charge is conducted to ground via the PMOS transistor, and negative charge is conducted to ground via the NMOS transistor at very low voltages. For example, the NMOS transistor will conduct at a voltage close to the junction forward turn on voltage of, for example, 0.6 V. Likewise, the PMOS transistor will conduct at a voltage close to the junction forward turn on voltage of, for example, −0.6 V. For a discussion of the operation of dynamic threshold MOS devices, see, IEEE ELECTRON DEVICES, Vol. 38, No. 11, November, 1991.

The gate oxide for the MOS pair is preferably thick enough to sustain high-voltage operation for flash memory devices or other high-voltage integrated circuits. The thick gate oxide can be easily manufactured in flash memory devices, by using the same processing step as is used to produce the thick oxides for charge pump transistors.

During manufacturing processes, plasma charge may accumulate and be conducted through the word line to the protection device. The number of protection devices used in a particular integrated circuit will depend on the manufacturing circumstances, the space available, and the needs of the particular product. There may be one protection device per word line, in some example products. In other example products, one protection device may be shared among a plurality of word lines. Other nodes in the integrated circuitry on the device can be protected as well.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit device, comprising:
   a device substrate;
   integrated circuitry on the device substrate to be protected from plasma damage during manufacture, the integrated circuitry conductively coupled to a node, and the node having operating voltages applied thereto during operation;
   a MOS transistor on the device substrate, having a gate, a semiconductor bulk conductively coupled to its gate, and a source and a drain in the semiconductor bulk;
   one of the source and drain of the MOS transistor being conductively coupled to said node, the other of the source and drain of the MOS transistor being conductively coupled to a ground reference;
   the gate of the MOS transistor floating during manufacture, and being conductively coupled to at least one of a positive voltage and a negative voltage, said at least one of the positive voltage and the negative voltage biasing the MOS transistor in a normally off condition during operation at said operating voltages.

2. The device of claim 1, wherein the integrated circuitry comprises a memory array having a word line, and said node is conductively coupled to said word line.

3. The device of claim 1, wherein the integrated circuitry comprises a memory array including SONOS memory cells, and a word line conductively coupled to a row of said SONOS memory cells, and said node is conductively coupled to said word line.

4. The device of claim 1, wherein the integrated circuitry includes charge pump circuitry on said substrate which supplies said operating voltages.

5. The device of claim 1, wherein said substrate comprises a p-type semiconductor material; and said MOS transistor includes
   a PMOS transistor comprising an n-type well in said substrate acting as its semiconductor bulk, and p-type source and drain regions in said n-type well.

6. The device of claim 1, wherein said substrate comprises a p-type semiconductor material; and said MOS transistor includes
   an NMOS transistor comprising an n-type well in said substrate, and a p-type well within said n-type well, the p-type well acting as its semiconductor bulk, and n-type source and drain regions in said p-type well.

7. An integrated circuit device, comprising:
   a device substrate;
   a non-volatile memory circuit on the device substrate to be protected from plasma damage during manufacture, the memory circuit including a plurality of word lines conductively coupled to memory cells in the memory circuit, at least one of the word lines being conductively coupled to a node, the memory circuit having a plurality of operating modes during which operating voltages are applied to word lines in the plurality of word lines;
   a PMOS device on the device substrate, having a gate, a semiconductor bulk conductively coupled to its gate, and a source and a drain in the semiconductor bulk;
   an NMOS device on the device substrate, having a gate, a semiconductor bulk conductively coupled to its gate, and a source and a drain in the semiconductor bulk; and
   one of the source and drain of the PMOS device being conductively coupled to said node, the other of the source and drain of the PMOS device being conductively coupled to a ground reference;
   one of the source and drain of the NMOS device being conductively coupled to said node, the other of the source and drain of the NMOS device being conductively coupled to a ground reference;
   the gate of the PMOS device floating during manufacture, and being conductively coupled to a first operation voltage sufficiently high to turn off the PMOS device during normal operation; and the gate of the NMOS device floating during manufacture, and being conductively coupled to a second operation voltage sufficiently low to turn off the NMOS device during normal operation.

8. The device of claim 7, wherein the plurality of operating modes includes a read mode, a program mode and an erase mode.

9. The device of claim 7, wherein the plurality of operating modes includes a read mode, a program mode and an erase mode, and wherein during the program mode, a programming voltage is applied to at least one word line in the plurality of word lines, and said one of the source and drain of the PMOS device receives a voltage higher than said programming voltage.

10. The device of claim 7, wherein the plurality of operating modes includes a read mode, a program mode and an erase mode, and wherein during the erase mode, an erasing voltage is applied to at least one word line in the plurality of word lines, and said one of the source and drain of the NMOS device receives a voltage lower than said erasing voltage.

11. The device of claim 7, wherein the memory circuit includes SONGS memory cells.

12. The device of claim 7, including charge pump circuitry on said substrate.

13. The device of claim 7, wherein said substrate comprises a p-type semiconductor material;

said PMOS device comprises an n-type well in said substrate acting as its semiconductor bulk, and p-type source and drain regions in said n-type well; and said NMOS device comprises an n-type well in said substrate, and a p-type well within said n-type well, the p-type well acting as its semiconductor bulk, and n-type source and drain regions in said p-type well.

14. An integrated circuit device, comprising:

a device substrate;

integrated circuitry on the device substrate to be protected from plasma damage during manufacture, the integrated circuitry conductively coupled to a node, and the node having operating voltages applied thereto during operation, wherein the integrated circuitry comprises a memory array having a word line, and said node is conductively coupled to said word line;

a MOS transistor on the device substrate, having a gate, a semiconductor bulk conductively coupled to its gate, and a source and a drain in the semiconductor bulk;

one of the source and drain of the MOS transistor being conductively coupled to said node, the other of the source and drain of the MOS transistor being conductively coupled to a ground reference;

the gate of the MOS transistor floating during manufacture, and being conductively coupled to a voltage biasing the MOS transistor in a normally off condition during operation at said operating voltages.

15. The device of claim 14, wherein the memory array includes SONOS memory cells, and the word line is conductively coupled to a row of said SONOS memory cells.

* * * * *